(12) United States Patent
Chen et al.

(10) Patent No.: US 10,778,158 B2
(45) Date of Patent: Sep. 15, 2020

(54) CONTROL CIRCUIT WITH BYPASS FUNCTION

(71) Applicant: RichWave Technology Corp., Taipei (TW)

(72) Inventors: Chih-Sheng Chen, Taipei (TW); Jhao-Yi Lin, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 50 days.

(21) Appl. No.: 16/233,012

(22) Filed: Dec. 26, 2018

(65) Prior Publication Data
US 2020/0083850 A1   Mar. 12, 2020

(30) Foreign Application Priority Data

Sep. 12, 2018  (TW) .............................. 107131987 A

(51) Int. Cl.
| | |
|---|---|
| *H03F 1/14* | (2006.01) |
| *H03F 3/21* | (2006.01) |
| *H03F 3/72* | (2006.01) |
| *H03F 1/02* | (2006.01) |

(52) U.S. Cl.
CPC .............. *H03F 3/21* (2013.01); *H03F 1/0277* (2013.01); *H03F 3/72* (2013.01); *H03F 2200/108* (2013.01); *H03F 2200/294* (2013.01); *H03F 2200/297* (2013.01)

(58) Field of Classification Search
CPC ................. H03F 3/21; H03F 2200/108; H03F 2200/294; H03F 2200/297; H03F 2200/111; H03F 2203/7239; H03F 2200/451; H03F 1/565; H03F 3/193; H03F 3/72; H03F 1/302; H03F 2200/18; H03F 1/301; H03F 1/0261; H03F 1/0277; H04B 1/006;
(Continued)

(56) References Cited

U.S. PATENT DOCUMENTS

| | | | | |
|---|---|---|---|---|
| 4,719,374 A | * | 1/1988 | Bialo | ................. H03K 17/6871 327/430 |
| 8,536,950 B2 | * | 9/2013 | Nejati | ..................... H03F 1/565 330/302 |
| 10,181,829 B2 | * | 1/2019 | Oshita | ..................... H03F 3/195 |

(Continued)

FOREIGN PATENT DOCUMENTS

CN          107733448 A       2/2018

*Primary Examiner* — Khanh V Nguyen
(74) *Attorney, Agent, or Firm* — Winston Hsu

(57) ABSTRACT

A control circuit with a bypass function includes a first signal terminal, a second signal terminal, an output terminal, a first switch unit to a fourth switch unit, an output switch unit and a bypass unit. The first signal terminal is used for receiving a first signal. The second signal terminal is used for receiving a second signal. The first switch unit is coupled to the first signal terminal. The second switch unit is coupled between the first switch unit and the output switch unit. The third switch unit is coupled to the second signal terminal. The fourth switch unit is coupled between the third switch unit and the output switch unit. The output switch unit is coupled between the second switch unit and the output terminal. The bypass unit is coupled between the first switch unit and the output terminal to provide a bypass path corresponding to the first signal.

20 Claims, 7 Drawing Sheets

(58) Field of Classification Search
CPC .. H03K 17/693; H03G 3/3042; H03G 3/3047; H03G 1/0088
USPC .......................................... 330/51, 285, 296
See application file for complete search history.

(56) References Cited

U.S. PATENT DOCUMENTS

| | | |
|---|---|---|
| 2009/0295472 A1 | 12/2009 | Vice |
| 2011/0025404 A1 | 2/2011 | Cassia |
| 2017/0149429 A1 | 5/2017 | Prevost |
| 2017/0163297 A1 | 6/2017 | Hou |

* cited by examiner

CONTROL CIRCUIT WITH BYPASS FUNCTION

CROSS REFERENCE TO RELATED APPLICATION

This application claims priority to Taiwan Patent Application No. 107131987, filed Sep. 12, 2018, and incorporated herein by reference in its entirety.

TECHNICAL FIELD

The present invention relates to a control circuit, and more particularly, a control circuit with a bypass function and having a bypass path for bypassing a signal.

BACKGROUND

In a front-end module receiver circuit for supporting multiple frequency bands, a plurality of input terminals can be set respectively corresponding to the multiple frequency bands. For example, in a single pole multiple throw (SPMT) radio-frequency switch circuit, every input terminal can receive a signal, and the signal can be transmitted through a matching component and a set of switches, enter a node, and then be outputted. The foresaid node can be coupled to a function path and a bypass path. If a switch of the function path is turned off, the circuit can enter a bypass mode for bypassing the signal through the bypass path. Although this sort of structure is feasible, many shortcomings have been observed in practice. For example, since switches and capacitors need to be set on the function path, the size of the circuit will be enlarged and can hardly be reduced. Moreover, since each of a plurality of paths having a plurality of switches connected in series are coupled to the node, the loading effect will be excessive, and this can be disadvantageous to the efficiency of the circuit. In the bypass mode, the loading effect will be particularly significant. Furthermore, the abovementioned structure will cause higher insertion loss (IL).

SUMMARY

An embodiment provides a control circuit with a bypass function. The control circuit comprises a first signal terminal, a second signal, an output terminal, a first switch unit, a second switch unit, a third switch unit, a fourth switch unit, a first output switch unit, and a first bypass unit. The first signal terminal is configured to receive a first signal. The second signal terminal is configured to receive a second signal. The output terminal is configured to output the first signal or the second signal. The first switch unit comprises a first terminal coupled to the first signal terminal, and a second terminal. The second switch unit comprises a first terminal coupled to the second terminal of the first switch unit, and a second terminal. The third switch unit comprises a first terminal coupled to the second signal terminal, and a second terminal. The fourth switch unit comprises a first terminal coupled to the second terminal of the third switch unit, and a second terminal coupled to the second terminal of the second switch unit. The first output switch unit comprises a first terminal coupled to the second terminal of the fourth switch unit, and a second terminal. The first bypass unit comprises a first terminal coupled to the second terminal of the first switch unit, and a second terminal coupled to the output terminal and the second terminal of the first output switch unit. The first bypass unit is configured to provide a first bypass path for bypassing the first signal.

Another embodiment provides a control circuit with a bypass function. The control circuit comprises a first signal terminal, a second signal terminal, an output terminal, a first switch unit, a second switch unit, a third switch unit, an output switch unit, and a bypass unit. The first signal terminal is configured to receive a first signal. The second signal terminal is configured to receive a second signal. The output terminal is configured to output the first signal or the second signal. The first switch unit comprises a first terminal coupled to the first signal terminal, and a second terminal. The second switch unit comprises a first terminal coupled to the second terminal of the first switch unit, and a second terminal. The third switch unit comprises a first terminal coupled to the second signal terminal, and a second terminal coupled to the second terminal of the second switch. The output switch unit comprises a first terminal coupled to the second terminal of the third switch unit, and a second terminal coupled to the output terminal. The bypass unit comprises a first terminal coupled to the second terminal of the first switch unit, and a second terminal coupled to the output terminal. The bypass unit is configured to provide a bypass path for bypassing the first signal.

DETAILED DESCRIPTION

Figure 1:
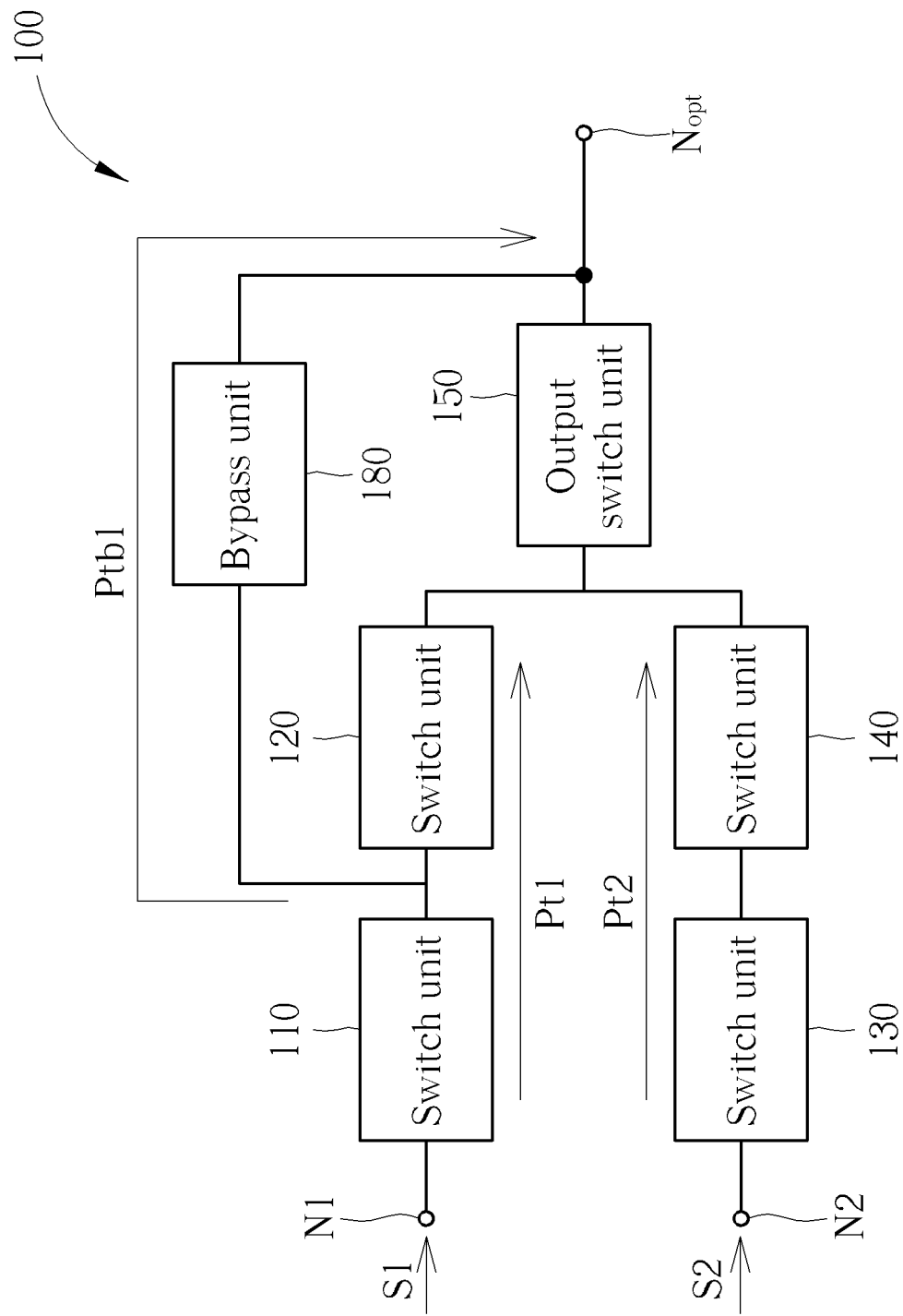
FIG. 1 illustrates a control circuit with a bypass function according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a control circuit 100 with a bypass function according to an embodiment. The control circuit 100 may include a first signal terminal N1, a second signal N2, an output terminal $N_{opt}$, switch units 110, 120, 130 and 140, an output switch unit 150, and a bypass unit 180. The first signal terminal N1 may be used to receive a first signal S1. The second signal terminal N2 may be used to receive a second signal S2. The output terminal $N_{opt}$ may be used to output the first signal S1 or the second signal S2. The switch unit 110 may include a first terminal and a second terminal where the first terminal is coupled to the first signal terminal N1. The switch unit 120 may include a first terminal and a second terminal where the first terminal is coupled to the second terminal of the switch unit 110. The switch unit 130 may include a first terminal and a second terminal where the first terminal is coupled to the second signal terminal N2. The switch unit 140 may include a first terminal and a second terminal where the first terminal is coupled to the second terminal of the switch unit 130, and the second terminal is coupled to the second terminal of the switch unit 120. The output switch unit 150 may include a first terminal and a second terminal where the first terminal is coupled to the second terminal of the switch unit 140. The bypass unit 180 may include a first terminal and a second terminal where the first terminal is coupled to the second terminal of the switch unit 110, and the second terminal is coupled to the output terminal $N_{opt}$ and the second terminal of the output switch unit 150. The bypass unit 180 may be used to provide a bypass path Ptb1 for bypassing the first signal S1.

As shown in FIG. 1, the switch unit 110 and the switch unit 120 form a first path Pt1, the switch unit 130 and the switch unit 140 form a second path Pt2, and the bypass unit 180 forms the first bypass path Ptb1.

In an operation mode of turning on the bypass path Ptb1, the switch unit 110 and the bypass unit 180 are turned on, and the switch unit 120, the switch unit 130, the switch unit 140 and the output switch unit 150 are turned off. Hence, the bypass path Ptb1 is turned on, a path passing through the switch unit 120 and the second path Pt2 are turned off, and the first signal S1 is transmitted through the bypass path Ptb1 and outputted from the output terminal $N_{opt}$.

In an operation mode of turning on the first path Pt1, the switch unit 110, the switch unit 120 and the output switch unit 150 are turned on, and the bypass unit 180, the switch unit 130 and the switch unit 140 are turned off. Hence, the first path Pt1 is turned on, the bypass path Ptb1 and the second path Pt2 are turned off, and the first signal S1 is transmitted through the first path Pt1 and outputted from the output terminal $N_{opt}$.

In an operation mode of turning on the second path Pt2, the switch unit 130, the switch unit 140 and the output switch unit 150 are turned on, and the switch unit 110 and the switch unit 120 and the bypass unit 180 are turned off. Hence, the second path Pt2 is turned on, the bypass path Ptb1 and the first path Pt1 are turned off, and the second signal S2 is transmitted through the second path Pt2 and outputted from the output terminal $N_{opt}$.

Figure 2:
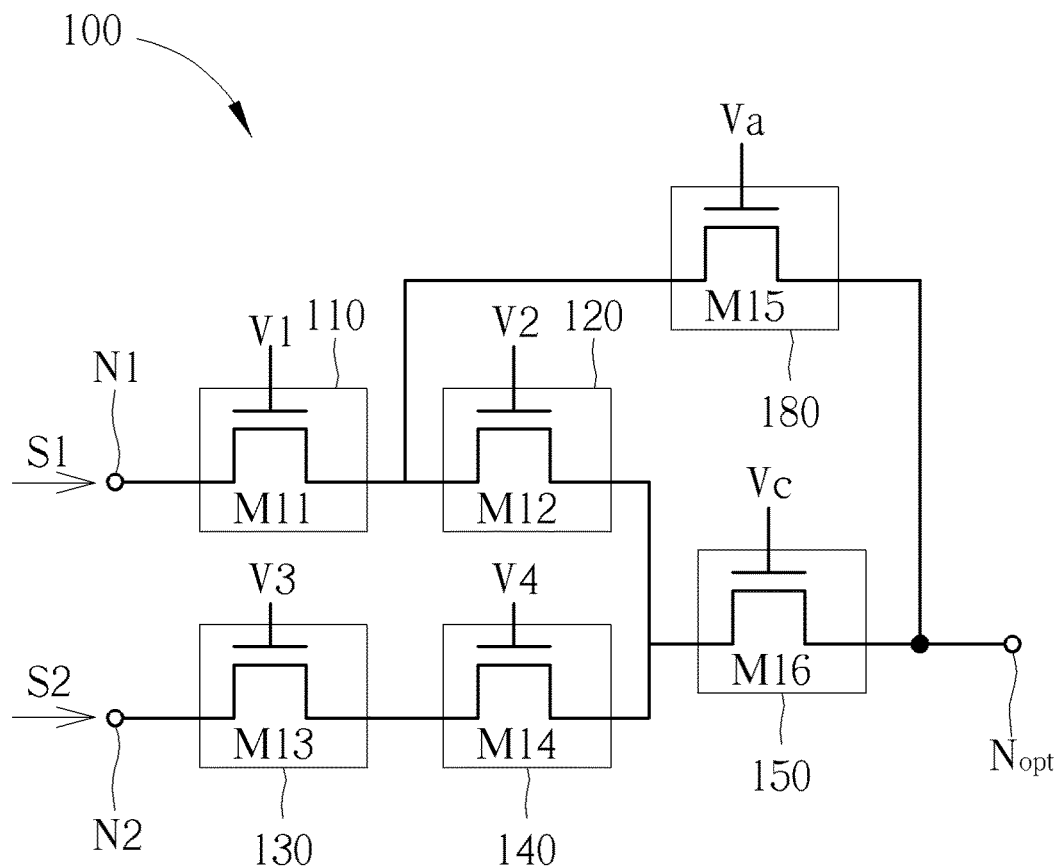
FIG. 2 illustrates the control circuit of FIG. 1 according to an embodiment.

FIG. 2 illustrates the control circuit 100 of FIG. 1 according to an embodiment. The switch unit 110 may further include a control terminal used to receive a control signal V1. The switch unit 120 may further include a control terminal used to receive a control signal V2. The switch unit 130 may further include a control terminal used to receive a control signal V3. The switch unit 140 may further include a control terminal used to receive a control signal V4. The switch unit 130 and the switch unit 140 may be synchronously turned on or turned off. According to the embodiment, the control signal V3 is equal to the control signal V4. The bypass unit 180 may further include a control terminal used to receive a control signal Va. The output switch unit 150 may further include a control terminal used to receive a control signal Vc. The abovementioned control terminals may be used to turn on or turn off the switch units 110 to 140, the bypass unit 180 and the output switch unit 150. The abovementioned control signals V1 to V4, Va and Vc may be voltage signals.

According to an embodiment, the switch units 110 to 140, the bypass unit 180 and the output switch unit 150 may respectively include transistors M11 to M16. Wherein, a size of the transistor M13 may be substantially equal to a size of the transistor M14. The size of the transistor M14 may be not larger than (≤) a size of the transistor M16. A size of the transistor M15 may be smaller than the size of the transistor M14. The size of the transistor M15 may not be larger than the size of the transistor M16. The transistors described in the text or in the figures are merely illustrative, and each transistor described herein may include one transistor or be formed with a plurality of transistors coupled to one another. The mentioned size of a transistor may be corresponding to a length and a width of a channel of the transistor, and/or the number of channels (Also known as the number of fingers).

In FIG. 2, each of the switch units 110 to 140, the bypass unit 180 and the output switch unit 150 may include a single transistor. However, according to embodiments, it is also allowed to use another appropriate type of switch or a switch formed with a plurality of transistors coupled to one another in a cascode structure.

Figure 3:
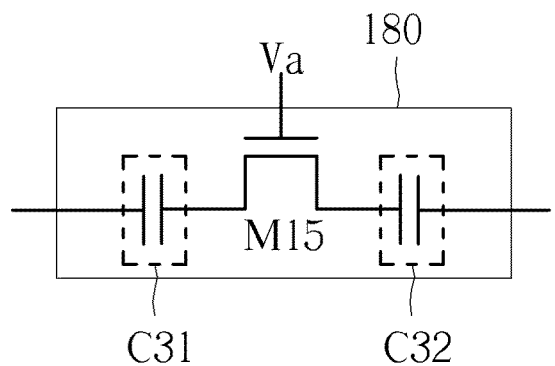
FIG. 3 illustrates the bypass unit of the control circuit of FIG. 1 according to another embodiment.

As shown in FIG. 2, the bypass unit 180 may include the transistor M15. A first terminal, a second terminal and a control terminal of the transistor M15 may be respectively coupled to the first terminal, the second terminal and the control terminal of the bypass unit 180. FIG. 3 illustrates the bypass unit 180 of FIG. 1 according to another embodiment. The bypass unit 180 may include at least one capacitor (e.g. the capacitor C31 and the capacitor C32) and a transistor M15. The at least one capacitor of the bypass unit 180 may be coupled in series between the first terminal of the transistor M15 and the first terminal of the bypass unit 180 (as the capacitor C31) or between the second terminal of the transistor M15 and the second terminal of the bypass unit 180 (as the capacitor C32). The transistor M15 of FIG. 2 and FIG. 3 may be replaced with a plurality of transistors coupled in a cascode structure, and control terminals of the plurality of transistors may be coupled to the control terminal of the bypass unit 180.

Figure 4:
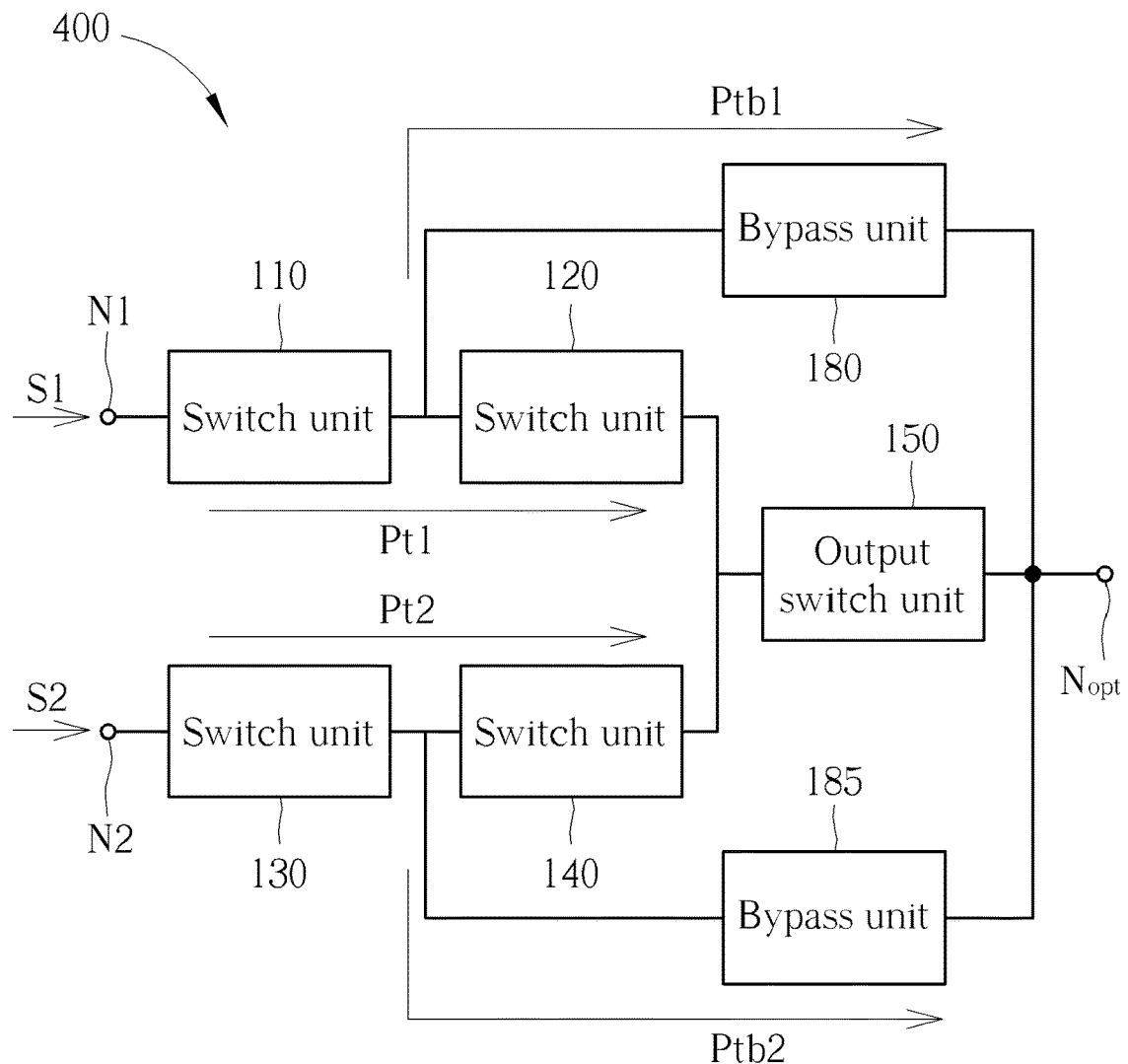
FIG. 4 illustrates a control circuit with a bypass function according to an embodiment.

FIG. 4 illustrates a control circuit 400 with a bypass function according to an embodiment. The switch units 110 to 140, the output switch unit 150 and the bypass unit 180 of FIG. 4 may be similar to the structure of FIG. 1. However, as shown in FIG. 4, the control circuit 400 may further include a bypass unit 185. The bypass unit 185 may include a first terminal, a second terminal and a control terminal where the first terminal is coupled to the second terminal of the switch unit 130, and the second terminal is coupled to the output terminal $N_{opt}$. The bypass unit 185 may be used to provide a bypass path Ptb2 for bypassing the second signal S2.

Like the bypass unit 180 of FIG. 2 and FIG. 3, the bypass unit 185 of FIG. 4 may include a single transistor including a first terminal, a second terminal and a control terminal respectively coupled to the first terminal, the second terminal and the control terminal of the bypass unit 185. According to another embodiment, the bypass unit 185 may include a plurality of transistors coupled to one another in a cascode structure.

Furthermore, according to another embodiment, the bypass unit 185 may include at least one transistor and at least one capacitor. When the bypass unit 185 includes two or more transistors, the transistors may be coupled to one another in a cascode structure, and control terminals of the transistors may be coupled to the control terminal of the bypass unit 185. The capacitors of the bypass unit 185 may be coupled in series between the transistor(s) of the bypass unit 185 and the first terminal of the bypass unit 185 and/or between the transistor(s) of the bypass unit 185 and the second terminal of the bypass unit 185. Since the circuit structure may be similar to the structure of the abovementioned bypass unit 180, it is not described repeatedly.

Figure 5:
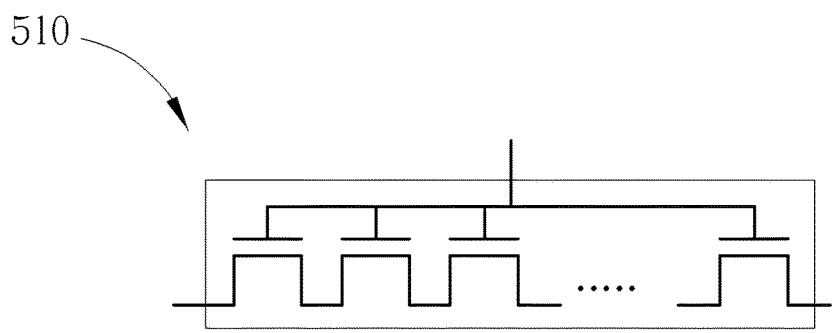
FIG. 5 illustrates a switch unit of the control circuit of FIG. 1 according to an embodiment.

FIG. 5 illustrates a switch unit 510 according to an embodiment. The switch unit 510 may be any one of the switch units 110 to 140 and the output switch unit 150. The switch unit 510 may include a plurality of switches coupled to one another in a cascode structure. When the switch unit 510 is turned on, the plurality of the switches of the switch unit 510 are turned on. Control terminals of the plurality of the switches of the switch unit 510 are coupled to a control terminal of the switch unit 510. A first terminal of a first switch of the plurality of the switches of the switch unit 510 may be a first terminal of the switch unit 510. A second terminal of a last switch of the plurality of switches of the switch unit 510 may be a second terminal of the switch unit 510. According to embodiments, the switch unit 510 may include at least one capacitor coupled in series among the plurality of switches, at a front terminal of the plurality of switches and/or at a back terminal of the plurality of switches.

Figure 6:
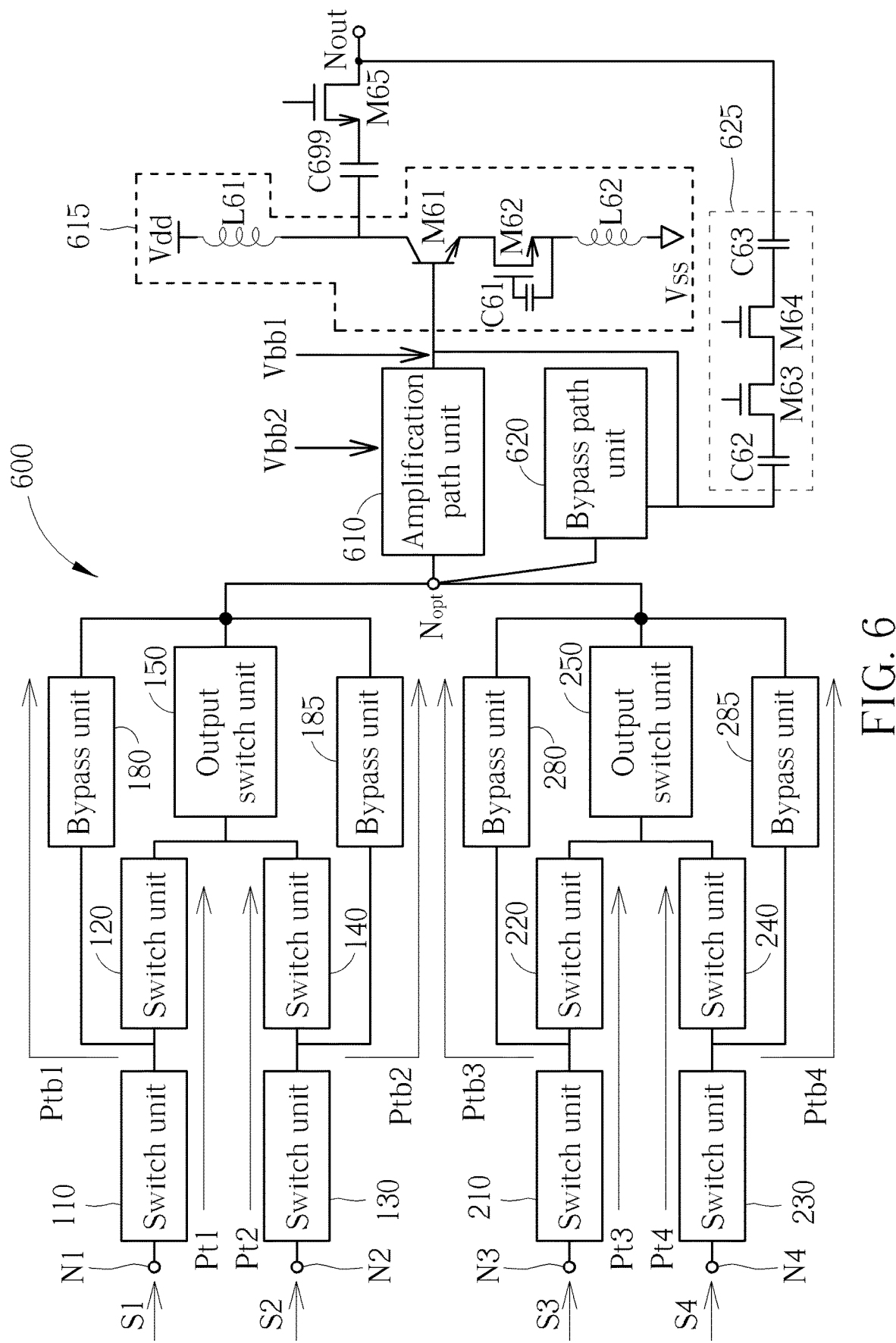
FIG. 6 illustrates an application of a control circuit with a bypass function according to embodiment.

FIG. 6 illustrates an application of a control circuit 600 with a bypass function according to embodiment. The control circuit 600 may include the components of the control circuit 100 of FIG. 1 or the control circuit 400 of FIG. 4. The similar components are not described repeatedly. For example, compared with FIG. 4, the control circuit 600 may further include a third signal terminal N3, a fourth signal terminal N4, switch units 210, 220, 230 and 240, an output switch unit 250 and bypass units 280 and 285. The third signal terminal N3 may be used to receive a third signal S3. The fourth signal terminal N4 may be used to receive a fourth signal S4. The switch unit 210 may include a first terminal and a second terminal where the first terminal is coupled to the third signal terminal N3. The switch unit 220 may include a first terminal and a second terminal where the first terminal is coupled to the second terminal of the switch unit 210. The switch unit 230 may include a first terminal and a second terminal where the first terminal is coupled to the fourth signal terminal N4. The switch unit 240 may include a first terminal and a second terminal where the first terminal is coupled to the second terminal of the switch unit 230, and the second terminal is coupled to the second terminal of the switch unit 220. The output switch unit 250 may include a first terminal and a second terminal where the first terminal is coupled to the second terminal of the switch unit 240, and the second terminal is coupled to the output terminal $N_{opt}$. The bypass unit 280 may include a first terminal and a second terminal where the first terminal is coupled to the second terminal of the switch unit 210, and the second terminal is coupled to the output terminal $N_{opt}$. The switch units 210 and 220 may form a third path Pt3 for transmitting the third signal S3. The bypass unit 280 is used to provide a bypass path Ptb3 for bypassing the third signal S3. The switch units 230 and 240 may form a fourth path Pt4 for transmitting the fourth signal S4. The bypass unit 285 is used to provide a bypass path Ptb4 for bypassing the fourth signal S4. The output terminal $N_{opt}$ may be used to output the first signal S1, the second signal S2, the third signal S3 or the fourth signal S4.

In FIG. 6, the switch units 110 to 140, the output switch unit 150 and the bypass units 180 and 185 used for receiving and transmitting the first signal S1 and the second signal S2 may be of a first set of components. The switch units 210 to 240, the output switch unit 250 and the bypass units 280 and 285 used for receiving and transmitting the third signal S3 and the fourth signal S4 may be of a second set of components. In FIG. 6, merely two sets of components are shown. However, according to embodiments, the output terminal $N_{opt}$ may further coupled to a third set of components and more sets of components for receiving and transmitting more signals.

As shown in FIG. 6, the output terminal $N_{opt}$ may be coupled to an amplification path unit 610 and a bypass path unit 620. The amplification path unit 610 may be further coupled to an amplifier circuit 615, and the amplifier circuit 615 may be used to amplify a signal outputted by the output terminal $N_{opt}$. The amplifier circuit 615 may include a low-noise amplifier or a power amplifier. In FIG. 6, the amplifier circuit 615 is an amplifier with a transistor cascode structure as an example. The amplifier circuit 615 of FIG. 6 may include transistors M61 and M62, inductors L61 and L62, and a capacitor C61. The amplifier circuit 615 may be coupled to a power terminal Vdd through an inductor L61 and to a reference voltage terminal Vss through an inductor L62. The circuit structure of the amplifier circuit 615 in FIG. 6 is merely an example instead of a limitation of the structure of the amplifier circuit 615. The amplification path unit 610 may include an amplification path switch used to turn on or turn off the amplification path unit 610. Furthermore, the amplification path unit 610 may include a capacitor coupled in a series structure and used for direct-current (DC) blocking. Furthermore, as shown in FIG. 6, a first terminal of the transistor M61 of the amplifier circuit 615 may be coupled to a first terminal of the transistor M65 through a capacitor C699. A second terminal of the transistor M65 may be coupled to an output terminal $N_{out}$.

As shown in FIG. 6, the bypass path unit 620 may be further coupled to the amplifier circuit 615 and a bypass circuit 625. The bypass circuit 625 may be used to bypass a signal outputted by the output terminal $N_{opt}$. The bypass path unit 620 may include at least one capacitor, be coupled to a control terminal of the transistor M61, and be used to adjust the input impedance matching of the amplifier circuit 615. For example, the bypass path unit 620 may include (but is not limited to) a capacitor, and the capacitor has a first terminal coupled to the output terminal $N_{opt}$ and a second terminal coupled to the control terminal of the transistor M61 and the bypass circuit 625. Furthermore, the bypass circuit 625 may include a single switch or a plurality of switches coupled to one another in a cascode structure, and at least one capacitor coupled to the switch of the bypass circuit 625 in a series structure. For example, the bypass circuit 625 of FIG. 6 may include transistors M63 and M64 and capacitors C62 and C63 where the transistors M63 and M64 may be switches. As shown in FIG. 6, the bypass circuit 625 may be coupled to the output terminal $N_{out}$.

As shown in FIG. 6, when a signal outputted by the output terminal $N_{opt}$ is amplified, the amplification path unit 610 may be turned on, the amplifier circuit 615 may be enabled, and the bypass circuit 625 may be turned off. Taking the circuit of FIG. 6 as an example, when a signal outputted by the output terminal $N_{opt}$ is amplified, a bias voltage Vbb1 may be adjusted at the control terminal of the transistor M61 to turn on the transistor M61. Furthermore, a bias voltage Vbb2 may be adjusted and inputted to the amplification path unit 610 to turn on an amplification path switch of the amplification path unit 610. In this condition, the output terminal $N_{out}$ may output a signal amplified by the amplifier circuit 615. The described bias voltages Vbb1 and Vbb2 may be provided by a bias voltage circuit.

Taking the circuit of FIG. 6 as an example, when a signal outputted by the output terminal $N_{opt}$ is bypassed, the bias voltage Vbb1 at the control terminal of the transistor M61 may be adjusted to turn off the transistor M61 and turn off the amplifier circuit 615. Furthermore, the bias voltage Vbb2 may be adjusted and inputted to the amplification path unit 610 to turnoff the amplification path switch of the amplification path unit 610. In this condition, the output terminal $N_{out}$ may output a signal transmitted through the bypass circuit 625.

Figure 7:
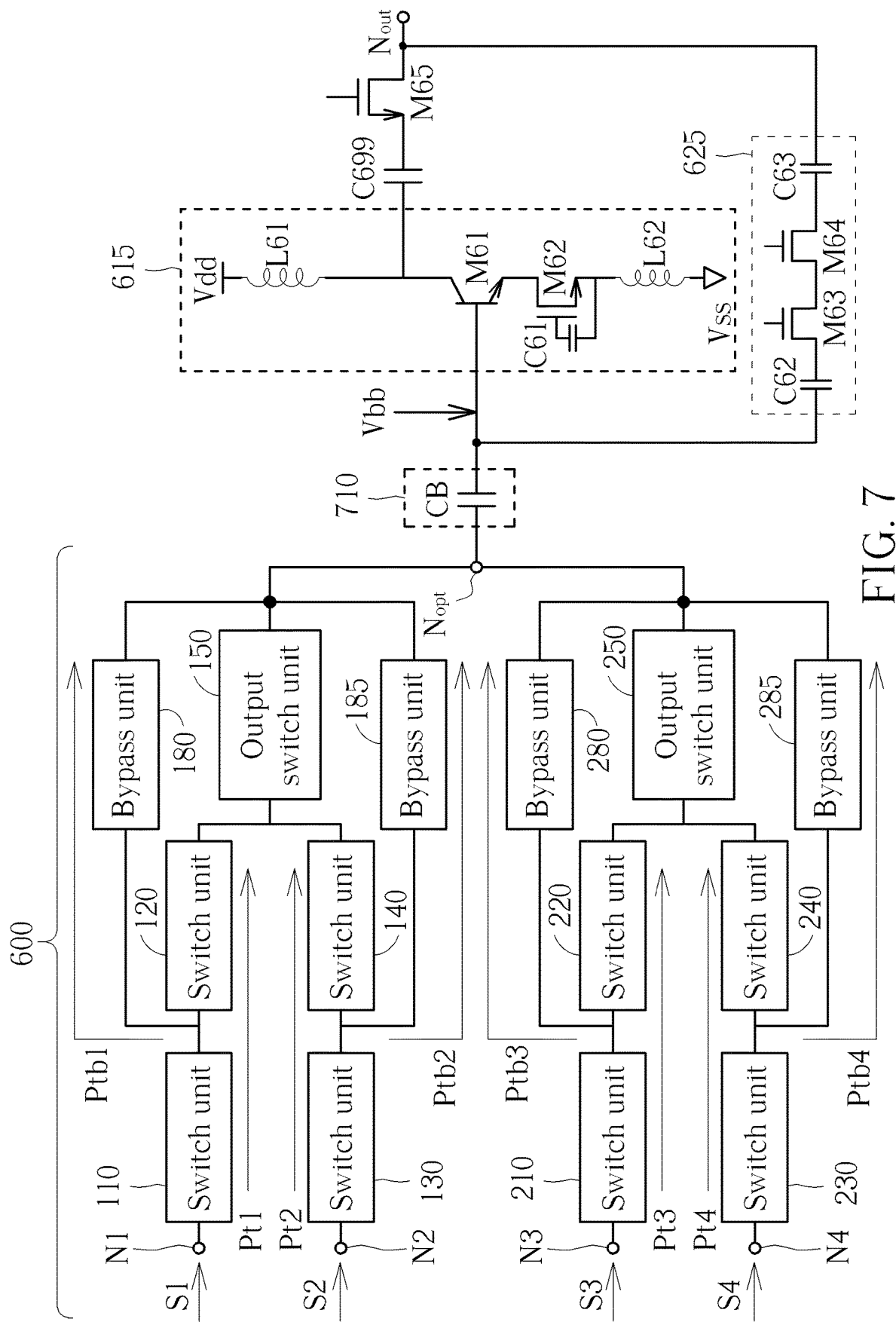
FIG. 7 illustrates an application of the control circuit according to another embodiment.

FIG. 7 illustrates an application of the control circuit 600 according to another embodiment. As shown in FIG. 7, the control circuit 600, the amplifier circuit 615 and a bypass circuit 625 may be similar to what is illustrated in FIG. 6, so these circuits are not described repeatedly. FIG. 7 is different from FIG. 6 in that the output terminal $N_{opt}$ may be coupled to a common path unit 710, and the common path unit 710 may be further coupled to the amplifier circuit 615 and the bypass circuit 625. As shown in FIG. 7, the common path unit 710 may include a capacitor CB which may be a direct-current blocking capacitor. According to embodiments, the capacitor CB may be optionally used or not used. When a signal outputted by the output terminal $N_{opt}$ is amplified, a bias voltage Vbb provided by a bias voltage circuit may be adjusted to turn on the transistor M61 and turn off the transistors M63 and M64 of the bypass circuit 625. When a signal outputted by the output terminal $N_{opt}$ is bypassed, the bias voltage Vbb may be adjusted to turn off the transistor M61 and turn on the transistors M63 and M64 of the bypass circuit 625. According to an embodiment, the control terminals of the transistors M63, M64 and M65 shown in FIG. 6 and FIG. 7 may be respectively coupled to suitable resistors.

Figure 8:
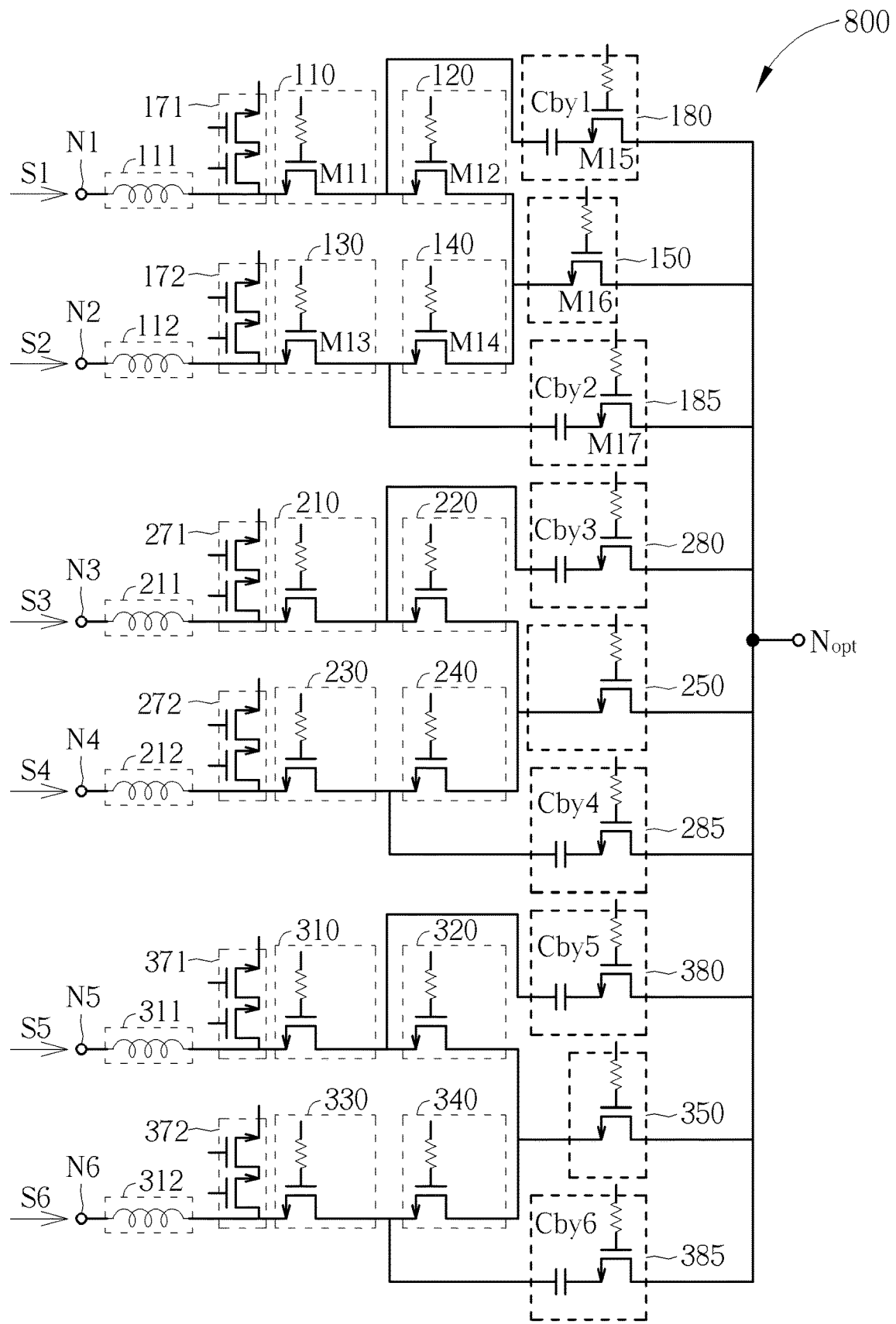
FIG. 8 illustrates a control circuit according to an embodiment.

FIG. 8 illustrates a control circuit 800 according to an embodiment. The output terminal $N_{opt}$ of FIG. 8 may be corresponding to the output terminal $N_{opt}$ of FIG. 7. In other words, the common path unit 710 of FIG. 7 may be coupled to the output terminal $N_{opt}$ of FIG. 8. The control circuit 600 of FIG. 7 may be used to receive and transmit the first signal S1 to the fourth signal S4. The control circuit 800 of FIG. 8 may be used to receive and transmit the first signal S1 to the sixth signal S6, and the control circuits 600 and 800 may be operated on similar principle. Compared with FIG. 6 and FIG. 7, the control circuit 800 of FIG. 8 illustrates more details of the circuit. FIG. 8 is merely an example instead of limiting the scope of embodiments. The control circuit 800 may include three sets of components. The first set of components may include the switch units 110 to 140, the bypass units 180 and 185, the output switch unit 150, shunt units 171 and 172, matching units 111 and 112, the first signal terminal N1 and the second signal terminal N2. Like FIG. 2, the switch units 110 to 140, the output switch unit 150 and the bypass units 180 and 185 may respectively include the transistors M11 to M14, M16, M15 and M17. The control terminals of the transistors M11 to M14, M16, M15 and M17 may be respectively coupled to suitable resistors for receiving control signals. Each of the shunt units 171 and 172 may include a set of transistors coupled to one another in a cascode structure, where each transistor may include a control terminal coupled to a suitable resistor to receive a control signal. A resistor coupled to a control terminal of a transistor may be a choking resistor. The matching units 111 and 112 of FIG. 8 are not depicted in the above description and figures for simplicity. According to an embodiment, a matching unit may be coupled to a signal terminal. A suitable matching component may be selected to be a matching unit according to a frequency band of a received signal. For example, the matching units 111 and 112 may be two inductors having inductance values respectively corresponding to the frequency bands of the first signal S1 and the second signal S2. The bypass unit 180 may include a capacitor Cby1, and the capacitor Cby1 may have a capacitance value corresponding to the frequency band of the first signal S1. The bypass unit 185 may include a capacitor Cby2, and the capacitor Cby2 may have a capacitance value corresponding to the frequency band of the second signal S2.

The second set of components of FIG. 8 may include the switch units 210 to 240, the bypass units 280 and 285, the output switch unit 250, shunt units 271 and 272, matching units 211 and 212, the third signal terminal N3 and the fourth signal terminal N4, and be used to receive the third signal S3 and the fourth signal S4. The bypass units 280 and 285 may respectively include capacitors Cby3 and Cby4. The capacitor Cby3 and the matching unit 211 may be corresponding to a frequency band of the third signal S3. The capacitor Cby4 and the matching unit 212 may be corresponding to a frequency band of the fourth signal S4.

The third set of components of FIG. 8 may include the switch units 310 to 340, the bypass units 380 and 385, the output switch unit 350, shunt units 371 and 372, matching units 311 and 312, the fifth signal terminal N5 and the sixth signal terminal N6, and be used to receive the fifth signal S5 and the sixth signal S6. The bypass units 380 and 385 may respectively include capacitors Cby5 and Cby6. The capacitor Cby5 and the matching unit 311 may be corresponding to a frequency band of the fifth signal S5. The capacitor Cby6 and the matching unit 312 may be corresponding to a frequency band of the sixth signal S6.

In FIG. 8, each of the second set of components and the third set of components may have a structure and an operation principle similar to that of the first set of components. The circuit of FIG. 8 may be corresponding to a single pole six throw (SP6T) switch. However, FIG. 8 merely provides an example instead of limiting the scope of embodiments. For example, the structure of FIG. 8 may be expanded to be used for a single pole multiple throw (SPMT) switch.

According to the embodiments of FIG. 7 and FIG. 8, the voltage at the control terminal of the transistor M62 of the amplifier circuit 615 may be 2.8 volts. A voltage at the second terminal of the transistor M62 which is a terminal coupled to the inductor L62 may be 0 volts. The transistors M61 and M62 of the amplifier circuit 615 may be a pair of bipolar transistors or a pair of metal-oxide-semiconductor field-effect transistors (MOSFETs). According to another embodiment, one of the transistors M61 and M62 may be a bipolar transistor, and another may be a MOSFET.

Figure 9:
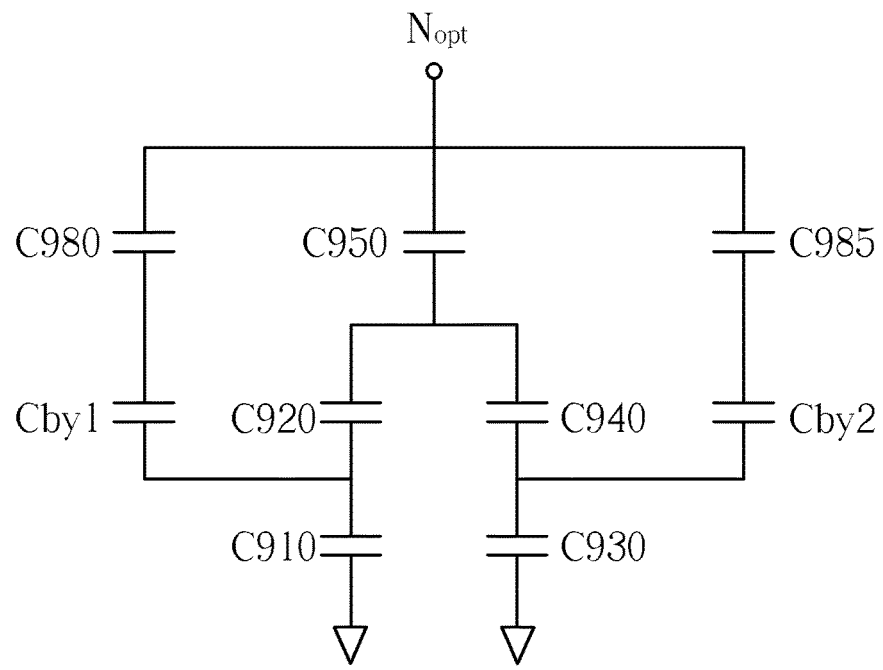
FIG. 9 illustrates a capacitor equivalent structure of the circuit of FIG. 8 for qualitative analysis.

FIG. 9 illustrates a capacitor equivalent structure of the circuits of FIG. 7 and FIG. 8 for qualitative analysis. By observing the first set of components of FIG. 7 at the output terminal $N_{opt}$ of FIG. 7 and FIG. 8 along a direction toward the first signal terminal N1 and the second signal terminal N2, the switch units 110 to 140, the output switch unit 150, the transistors M15 and the transistor M17 may be respectively expressed as equivalent capacitors C910 to C940, C950, C980 and C985. The capacitors Cby1 and Cby2 of FIG. 9 may be coupled at the positions shown in FIG. 8 to obtain the equivalent circuit of FIG. 9. An equivalent capacitor of a transistor may be a drain-source capacitor. After entering a bypass mode, the transistors M12, M14 and M16 may be turned off. According to an embodiment, sizes of the capacitor Cby1, the capacitor Cby2 and the transistors may be adjusted to adjust the equivalent capacitances. For example, capacitance value of each of the capacitors Cby1 and Cby2 may be 1 picofarad ($10^{-12}$ farad). Each of the equivalent capacitors C980 and C985 may have a capacitance value of 32 femtofarads, where 1 femtofarad is $10^{-15}$ farads. Each of the equivalent capacitors C910, C920, C930 and C940 may have a capacitance value of 1300 femtofarads. The equivalent capacitor C950 may have a capacitance value of 2600 femtofarads. The first signal terminal N1 and the second signal terminal N2 may be regarded as equivalent reference voltage terminals. Hence, by means of calculations regarding the capacitors coupled in series and in parallel, an equivalent capacitance value of 1300 femtofarads observed from the output terminal $N_{opt}$ into the circuit may be obtained, and this equivalent capacitance value may be approximately an equivalent capacitance value of a single transistor. Hence, by means of the circuit structure provided by an embodiment, loading effect may be reduced. The effect of reducing loading effect may be more significant when bypassing a signal. According to calculation, an equivalent load is hardly influenced by components of a bypass path. Furthermore, because a functional path can be omitted from the output terminal $N_{opt}$ to the bypass circuit 625 and the amplifier circuit 615, it may be avoided to set switches and capacitors on a functional path, and the layout of the circuit may be more compact so as to occupy a smaller area. Furthermore, the insertion loss may be reduced according to an embodiment. The abovementioned capacitance values are merely used as examples rather than limiting the specifications of the components, and the specifications of the components may be adjusted according to requirements.

Figure 10:
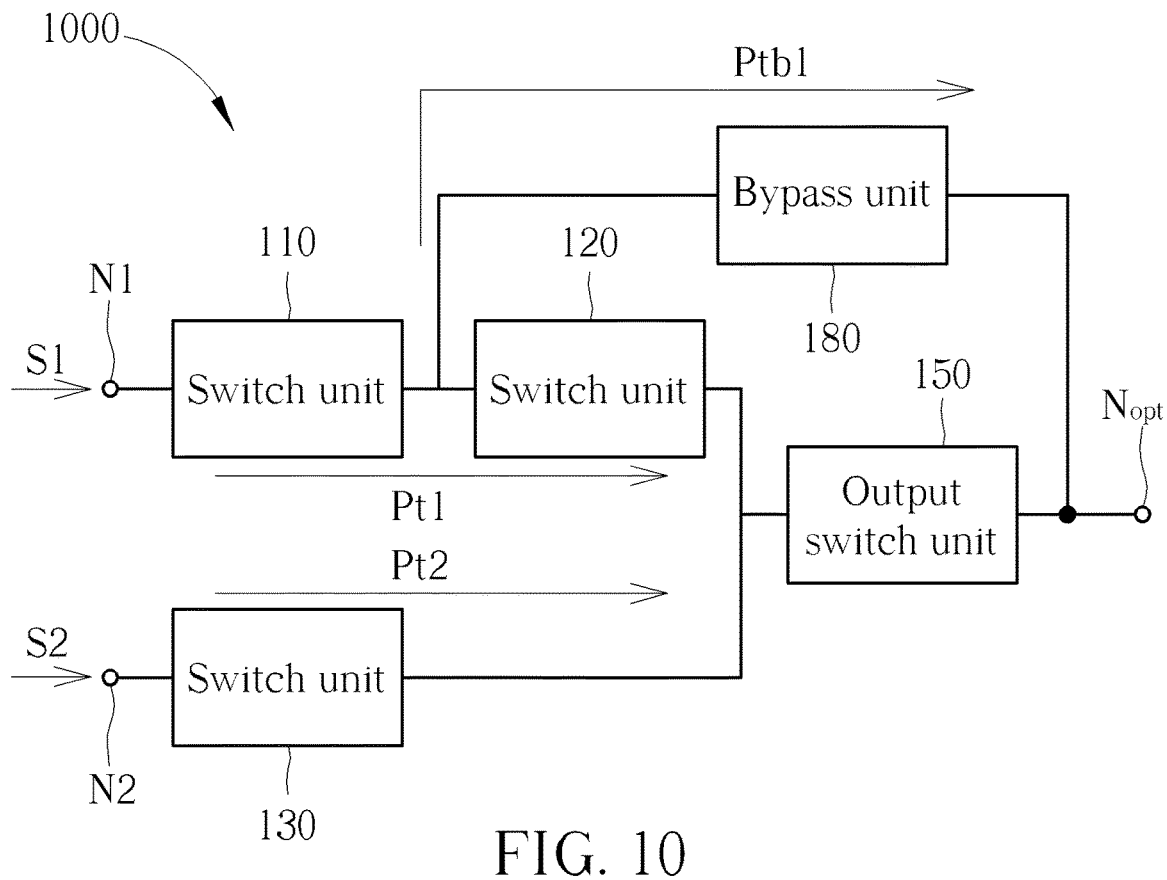
FIG. 10 illustrates a control circuit with a bypass function according to an embodiment.

FIG. 10 illustrates a control circuit 1000 with a bypass function according to an embodiment. The components, the terminals and the couplings of the control circuit 1000 may be similar to what of the control circuit 100 of FIG. 1, and the similarities are not described repeatedly. A difference from FIG. 1 to FIG. 10 is that the switch unit 140 may be omitted in FIG. 10. As shown in FIG. 10, the switch unit 130 may include a first terminal and a second terminal where the first terminal may be coupled to the second signal terminal N2 and the second terminal may be coupled to the first terminal of the output switch unit 150. In other words, the control circuit 1000 may merely provide the bypass path Ptb1 for bypassing the first signal, and this simpler structure is also of the scope of embodiments.

In summary, by means of a control circuit provided by an embodiment, it is allowed to switch paths to amplify an inputted signal using an amplifier or bypass the signal. It is also allowed to omit unnecessary switches and capacitors. Hence, the layout may be more compact, and loading effect and insertion loss may be decreased. As a result, the invention is useful for alleviating engineering problems in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit with a bypass function, the control circuit comprising:
    a first signal terminal configured to receive a first signal;
    a second signal terminal configured to receive a second signal;
    an output terminal configured to output the first signal or the second signal;
    a first switch unit comprising a first terminal coupled to the first signal terminal, and a second terminal;
    a second switch unit comprising a first terminal coupled to the second terminal of the first switch unit, and a second terminal;
    a third switch unit comprising a first terminal coupled to the second signal terminal, and a second terminal;
    a fourth switch unit comprising a first terminal coupled to the second terminal of the third switch unit, and a second terminal coupled to the second terminal of the second switch unit;
    a first output switch unit comprising a first terminal coupled to the second terminal of the fourth switch unit, and a second terminal; and
    a first bypass unit comprising a first terminal coupled to the second terminal of the first switch unit, and a second terminal coupled to the output terminal and the second terminal of the first output switch unit, wherein the first bypass unit is configured to provide a first bypass path for bypassing the first signal.

2. The control circuit of claim 1, wherein:
    the first switch unit and the second switch unit form a first path, the third switch unit and the fourth switch unit form a second path, and the first bypass unit forms the first bypass path;
    the first bypass path is turned on, and the first path and the second path are turned off so that the first signal is transmitted through the first bypass path and outputted from the output terminal when the first switch unit and the first bypass unit are turned on, and the second switch unit, the third switch unit, the fourth switch unit and the first output switch unit are turned off;
    the first path is turned on, and the first bypass path and the second path are turned off so that the first signal is transmitted through the first path and outputted from the output terminal when the first switch unit, the second switch unit and the first output switch unit are turned on, and the first bypass unit, the third switch unit and the fourth switch unit are turned off; and
    the second path is turned on, and the first bypass path and the first path are turned off so that the second signal is transmitted through the second path and outputted from the output terminal when the third switch unit, the fourth switch unit and the first output switch unit are turned on, and the first switch unit, the second switch unit and the first bypass unit are turned off.

3. The control circuit of claim 1, wherein:
    the first switch unit further comprises a control terminal configured to receive a first control signal;
    the second switch unit further comprises a control terminal configured to receive a second control signal;
    the third switch unit further comprises a control terminal configured to receive a third control signal;
    the fourth switch unit further comprises a control terminal configured to receive a fourth control signal;
    the third switch unit and the fourth switch unit are synchronously turned on or turned off;
    the first bypass unit further comprises a control terminal configured to receive a fifth control signal; and
    the first output switch unit further comprises a control terminal configured to receive a sixth control signal.

4. The control circuit of claim 1, wherein:
    the first switch unit, the second switch unit, the third switch unit, the fourth switch unit, the first bypass unit and the first output switch unit respectively comprise a first transistor, a second transistor, a third transistor, a fourth transistor, a fifth transistor and a sixth transistor; and a size of the third transistor is substantially equal to a size of the fourth transistor, the size of the fourth transistor is not larger than a size of the sixth transistor, a size of the fifth transistor is smaller than the size of the fourth transistor, and the size of the fifth transistor is not larger than the size of the sixth transistor.

5. The control circuit of claim 1, wherein the first bypass unit comprises a transistor, the transistor comprises a first terminal coupled to the first terminal of the first bypass unit, a control terminal coupled to a control terminal of the first bypass unit, and a second terminal coupled to the second terminal of the first bypass unit.

6. The control circuit of claim 1, wherein:
the first bypass unit comprises at least one capacitor and a transistor;
the transistor comprises a first terminal, a control terminal coupled to a control terminal of the first bypass unit, and a second terminal; and
the at least one capacitor is coupled in series between the first terminal of the transistor and the first terminal of the first bypass unit or between the second terminal of the transistor and the second terminal of the first bypass unit.

7. The control circuit of claim 1, further comprising:
a second bypass unit comprising a first terminal coupled to the second terminal of the third switch unit, and a second terminal coupled to the output terminal, wherein the second bypass unit is configured to provide a second bypass path for bypassing the second signal.

8. The control circuit of claim 7, wherein the second bypass unit comprises a transistor, and the transistor comprises a first terminal coupled to the first terminal of the second bypass unit, a control terminal coupled to a control terminal of the second bypass unit, and a second terminal coupled to the second terminal of the second bypass unit.

9. The control circuit of claim 1, wherein:
the first switch unit comprises a plurality of switches coupled to one another in a cascode structure; and
the plurality of switches of the first switch unit are turned on when the first switch unit is turned on.

10. The control circuit of claim 1, wherein:
the second switch unit comprises a plurality of switches coupled to one another in a cascode structure; and
the plurality of switches of the second switch unit are turned on when the second switch unit is turned on.

11. The control circuit of claim 1, wherein:
the third switch unit comprises a plurality of switches coupled to one another in a cascode structure; and
the plurality of switches of the third switch unit are turned on when the third switch unit is turned on.

12. The control circuit of claim 1, wherein:
the fourth switch unit comprises a plurality of switches coupled to one another in a cascode structure; and
the plurality of switches of the fourth switch unit are turned on when the fourth switch unit is turned on.

13. The control circuit of claim 1, further comprising:
a third signal terminal configured to receive a third signal;
a fourth signal terminal configured to receive a fourth signal;
a fifth switch unit comprising a first terminal coupled to the third signal terminal, and a second terminal;
a sixth switch unit comprising a first terminal coupled to the second terminal of the fifth switch unit, and a second terminal;
a seventh switch unit comprising a first terminal coupled to the fourth signal terminal, and a second terminal;
an eighth switch unit comprising a first terminal coupled to the second terminal of the seventh switch unit, and a second terminal coupled to the second terminal of the sixth switch unit;
a second output switch unit comprising a first terminal coupled to the second terminal of the eighth switch unit, and a second terminal coupled to the output terminal; and
a third bypass unit comprising a first terminal coupled to the second terminal of the fifth switch unit, and a second terminal coupled to the output terminal, wherein the third bypass unit is configured to provide a third bypass path for bypassing the third signal;
wherein the output terminal is further configured to output the third signal or the fourth signal.

14. The control circuit of claim 1, wherein the output terminal is coupled to an amplification path unit and a bypass path unit.

15. The control circuit of claim 14, wherein the amplification path unit is further coupled to an amplifier circuit, and the amplifier circuit is configured to amplify a signal outputted by the output terminal.

16. The control circuit of claim 14, wherein the bypass path unit is further coupled to a bypass circuit, and the bypass circuit is configured to bypass a signal outputted by the output terminal.

17. The control circuit of claim 14, wherein the amplification path unit comprises an amplification path switch configured to turn on or turn off the amplification path unit.

18. The control circuit of claim 1, wherein the output terminal is further coupled to a common path unit, and the common path unit is further coupled to an amplification circuit and a bypass circuit.

19. The control circuit of claim 18, wherein the amplification circuit is configured to amplify a signal outputted by the output terminal, and the bypass circuit is configured to bypass the signal outputted by the output terminal.

20. A control circuit with a bypass function, the control circuit comprising:
a first signal terminal configured to receive a first signal;
a second signal terminal configured to receive a second signal;
an output terminal configured to output the first signal or the second signal;
a first switch unit comprising a first terminal coupled to the first signal terminal, and a second terminal;
a second switch unit comprising a first terminal coupled to the second terminal of the first switch unit, and a second terminal;
a third switch unit comprising a first terminal coupled to the second signal terminal, and a second terminal coupled to the second terminal of the second switch;
an output switch unit comprising a first terminal coupled to the second terminal of the third switch unit, and a second terminal coupled to the output terminal; and
a bypass unit comprising a first terminal coupled to the second terminal of the first switch unit, and a second terminal coupled to the output terminal, wherein the bypass unit is configured to provide a bypass path for bypassing the first signal.

* * * * *